United States Patent
Chen et al.

(10) Patent No.: US 7,679,451 B2
(45) Date of Patent: *Mar. 16, 2010

(54) POWER SUPPLY DEVICE FOR DRIVING AN AMPLIFIER

(75) Inventors: Fu-Yuan Chen, Kao-Hsiung Hsien (TW); Chung-An Hsieh, Hsinchu (TW); Yueh-Ping Yu, Hualien County (TW)

(73) Assignee: Anpec Electronics Corporation, Hsin-Chu (TW)

( * ) Notice: Subject to any disclaimer, the term of this patent is extended or adjusted under 35 U.S.C. 154(b) by 168 days.

This patent is subject to a terminal disclaimer.

(21) Appl. No.: 12/105,289

(22) Filed: Apr. 18, 2008

(65) Prior Publication Data
US 2009/0278608 A1 Nov. 12, 2009

Related U.S. Application Data

(62) Division of application No. 11/610,483, filed on Dec. 13, 2006, now Pat. No. 7,382,195.

(60) Provisional application No. 60/822,084, filed on Aug. 11, 2006.

(51) Int. Cl.
*H03F 3/04* (2006.01)
(52) U.S. Cl. ....................... 330/297; 330/296
(58) Field of Classification Search ................ 330/297, 330/296, 285, 307
See application file for complete search history.

(56) References Cited

U.S. PATENT DOCUMENTS

| 5,289,137 | A | * | 2/1994 | Nodar et al. ................. 330/296 |
| 6,011,440 | A | * | 1/2000 | Bell et al. ................... 330/297 |
| 6,323,729 | B1 | | 11/2001 | Sevenhans |
| 6,791,407 | B2 | | 9/2004 | Grebennikov |
| 6,920,336 | B2 | | 7/2005 | Ferianz |
| 6,927,625 | B2 | | 8/2005 | Yamaguchi |
| 7,061,327 | B2 | * | 6/2006 | Doy ........................... 330/297 |
| 7,061,328 | B2 | * | 6/2006 | Doy ........................... 330/297 |
| 2002/0017953 | A1 | | 2/2002 | Singor |
| 2004/0135638 | A1 | | 7/2004 | Singor |
| 2005/0083126 | A1 | | 4/2005 | Singor |

* cited by examiner

*Primary Examiner*—Henry K Choe
(74) *Attorney, Agent, or Firm*—Winston Hsu

(57) ABSTRACT

A power supply device for driving an amplifier includes a power generator for providing a first voltage for a first power reception end of the amplifier, a power conversion unit coupled to the power generator, for converting the first voltage into a second voltage, a charge pump coupled between the power conversion unit and a second power reception end of the amplifier, for generating a third voltage for the amplifier according to the second voltage, and a control unit coupled to the power conversion unit, for controlling the power conversion unit, so as to adjust the second voltage to make the third voltage equal to a specific multiple of the first voltage.

5 Claims, 6 Drawing Sheets

POWER SUPPLY DEVICE FOR DRIVING AN AMPLIFIER

CROSS REFERENCE TO RELATED APPLICATIONS

This is a division of application Ser. No. 11/610,483, filed Dec. 13, 2006, which claims the benefit of U.S. Provisional Application No. 60/822,084, filed Aug. 11, 2006, the entirety of which is incorporated by reference.

BACKGROUND OF THE INVENTION

1. Field of the Invention

The present invention relates to a power supply device for driving an amplifier, and more particularly, to a power supply device capable of reducing power consumption of an amplifier and enlarging an output range of the amplifier.

2. Description of the Prior Art

An amplifier is an electronic device used in a variety of electronic products, which can amplify signal amplitudes. The amplifier appears in many types and structures, which can be simply composed of a bipolar junction transistor (BJT) or a metal oxide semiconductor (MOS) transistor, or be integrated by complicated circuits such as OP 741.

The amplifier is widely used in many applications. For example, U.S. Pat. No. 7,061,327 discloses a headset using a single voltage supply to drive an operational amplifier of the headset via a charge pump. Furthermore, U.S. Pat. No. 5,289,137 discloses an integrated circuit using a single power supply and a charge pump for driving an operational amplifier. Both of the U.S. Pat. Nos. 7,061,327 and 5,289,137 use single power supplies with charge pumps for driving the amplifier. However, shortcomings of these two patents are power consumption and restriction of output ranges. The details are described as bellows. Please refer to FIG. 1, which reveals a schematic diagram of signals corresponding to an amplifier in FIG. 4 of the U.S. Pat. No. 7,061,327. Voltages $V_{DD}$ and $V_{SS}$ respectively represent a positive voltage and a negative voltage for driving the amplifier. Since the U.S. Pat. No. 7,061,327 uses single power supply with a charge pump, the voltage $V_{DD}$ can keep a relation by $V_{SS}=-V_{DD}$. In addition, the charge pump is substantially composed of capacitors and thereby, generates the Voltage $V_{SS}$ via charging and discharging of the capacitors. Under this circumstance, the voltage $V_{SS}$ performs as an unstable linear curve rippling as the capacitors are charged and discharged. Since amplitudes of output signals of the amplifier must be restricted between the voltages $V_{DD}$ and $V_{SS}$, negative amplitude of the amplifier may be curtailed as a variation range of the voltage $V_{SS}$ becomes large. In order to solve the problem, the prior art can increase the voltage $V_{DD}$ so that the output range of the amplifier can be enlarged, or increase capacitance of the capacitors in the charge pump. However, increasing the voltage $V_{DD}$ represents increasing power consumption, while increasing capacitance of the capacitors in the charge pump represents increasing the capacitor size.

Therefore, using a single power supply with a charge pump for driving an amplifier results in a restriction of an output range of the amplifier, and power consumption cannot be efficiently reduced. Besides, if a single power supply is used for driving multiple amplifiers, current variation produced by switching transistors of a certain amplifier may cause malfunction of the power supply, and reduces system efficiency.

SUMMARY OF THE INVENTION

It is therefore a primary objective of the claimed invention to provide a power supply device for driving an amplifier.

The present invention discloses a power supply device for driving an amplifier, which comprises a power generator for providing a first voltage for a first power reception end of the amplifier, a power conversion unit coupled to the power generator, for converting the first voltage into a second voltage, a charge pump coupled between the power conversion unit and a second power reception end of the amplifier, for generating a third voltage for the amplifier according to the second voltage, and a control unit coupled to the power conversion unit, for controlling the power conversion unit, so as to adjust the second voltage to make the third voltage equal to a specific multiple of the first voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
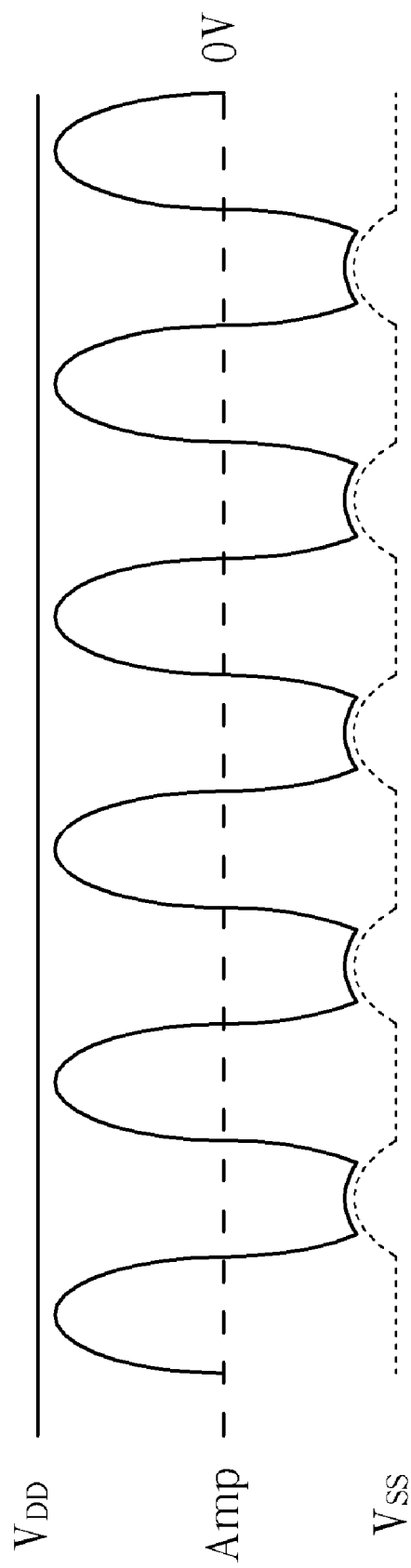
FIG. 1 depicts a schematic diagram of signals corresponding to an amplifier according to a FIG. 4 of the U.S. Pat. No. 7,061,327.
Figure 2:
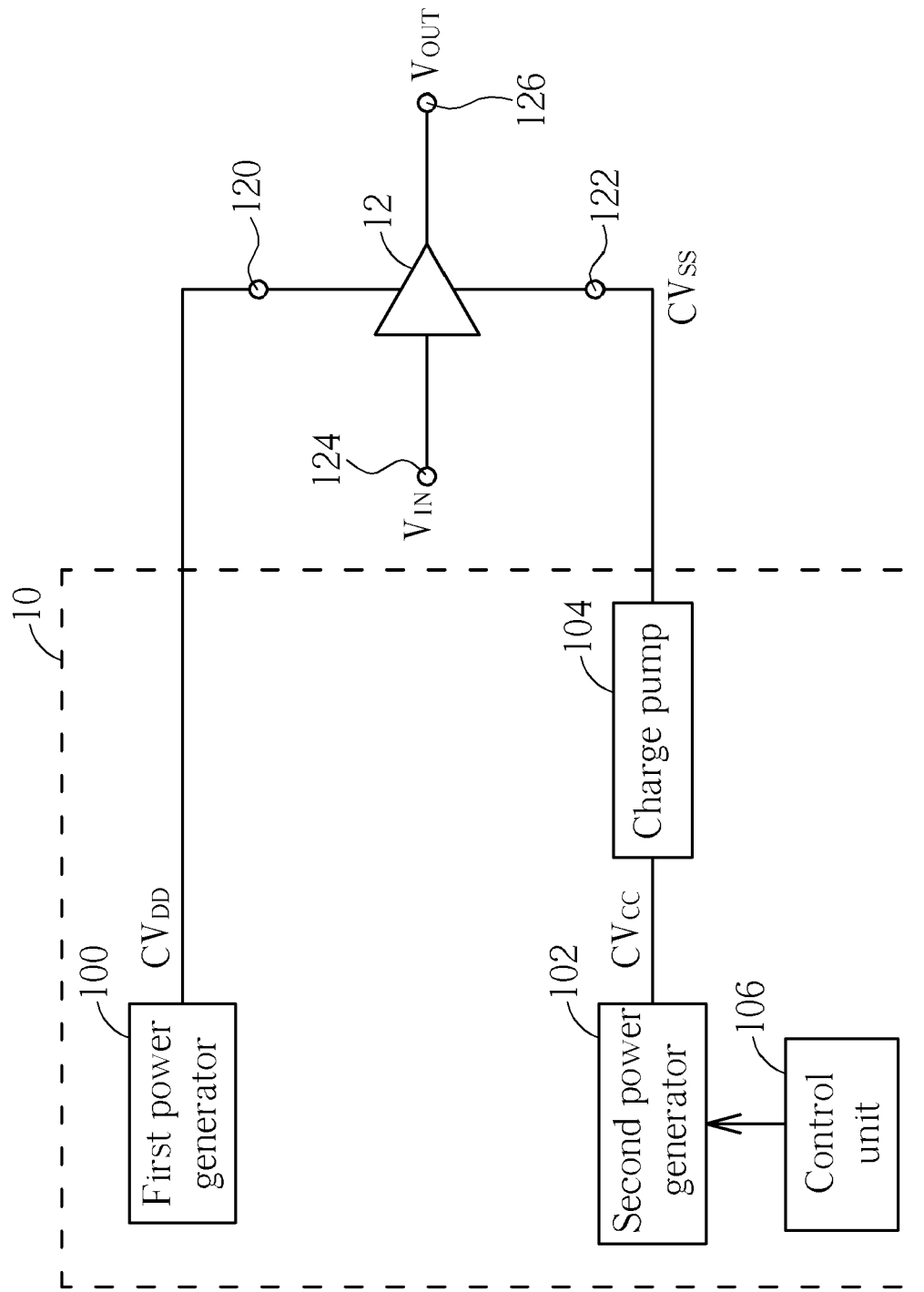
FIG. 2 depicts a schematic diagram of a power supply device for driving an amplifier according to a first embodiment of the present invention.

Please refer to FIG. 2, which is a schematic diagram of a power supply device 10 for driving an amplifier 12 according to an embodiment of the present invention. The amplifier 12 receives driving power through a positive power reception end 120 and a negative power reception end 122, amplifies a signal $V_{IN}$ received by a signal reception end 124, and outputs a signal $V_{OUT}$ from a signal output end 126. The power supply device 10 includes a first power generator 100, a second power generator 102, a charge pump 104, and a control unit 106. The first power generator 100 and the second power generator 102 generate voltages $CV_{DD}$ and $CV_{CC}$ for a positive power reception end 120 of the amplifier 12 and the charge pump 104. The charge pump 104 converts the voltage $CV_{CC}$ provided by the second power generator 102 into a negative voltage $CV_{SS}$, $CV_{SS}=(-n2) \times CV_{CC}$, and outputs the voltage $CV_{SS}$ to the negative power reception end 122 of the amplifier 12. Thus, positive and negative powers driving the amplifier 12 are provided by different power generators. The control unit 106 controls the voltage $CV_{CC}$ of the second power generator 102, so as to adjust the voltage $CV_{SS}$ to make the voltage $CV_{DD}$ equal to a multiple of the voltage $CV_{SS}$, or $CV_{SS}=(-n)\times CV_{DD}$.

Figure 3:
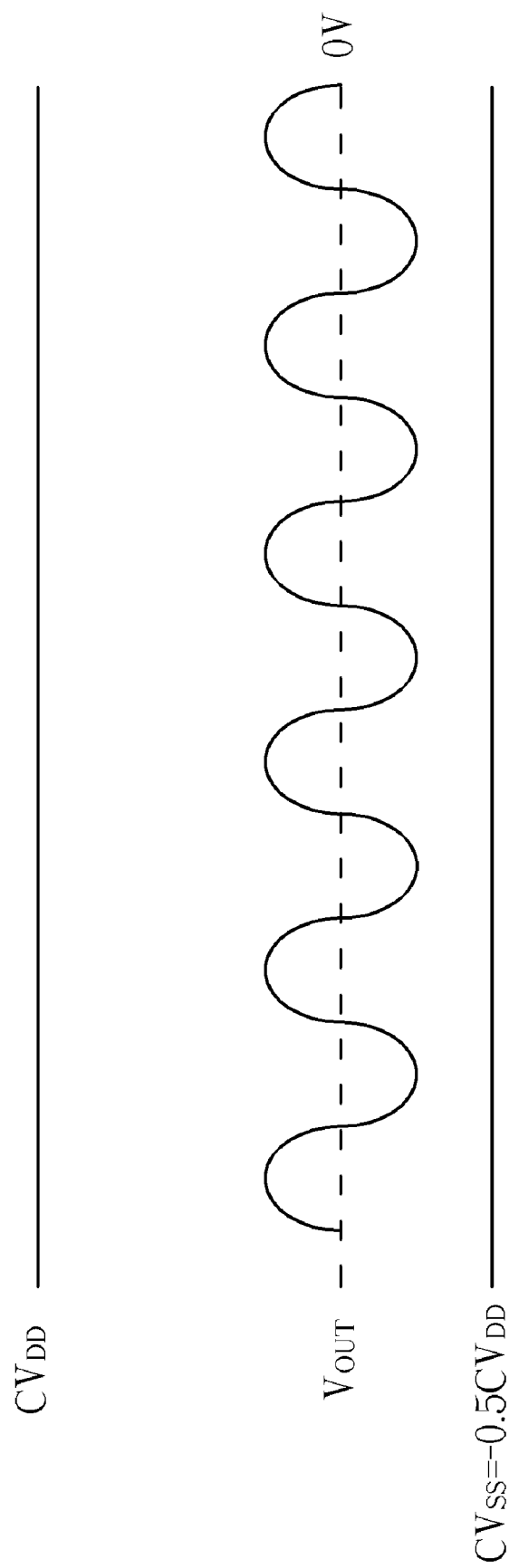
FIG. 3 depicts a schematic diagram of signal waveforms corresponding to the amplifier in FIG. 2 in a power saving mode.
Figure 4:
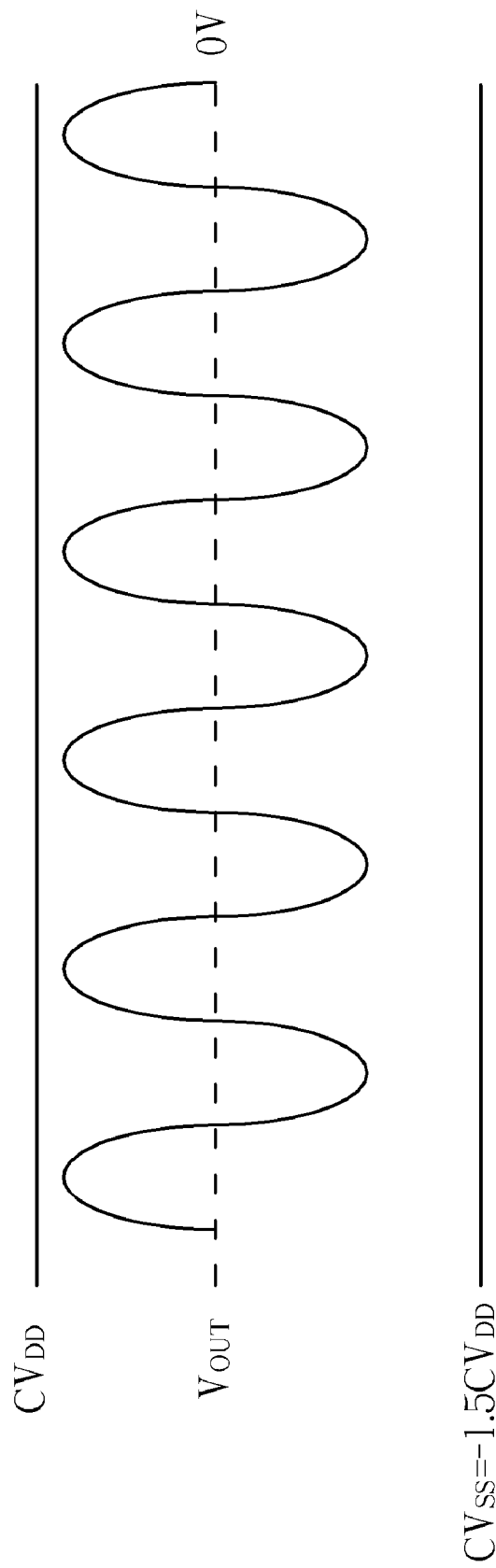
FIG. 4 depicts a schematic diagram of signal waveforms corresponding to the amplifier in FIG. 2 in a normal mode.

Therefore, in the power supply device 10, levels of positive and negative powers of the amplifier 12 may be different for applying to different situations. For example, please refer to FIG. 3 and FIG. 4. FIG. 3 is a schematic diagram of signal waveforms corresponding to the amplifier 12 in a condition of n=0.5, while FIG. 4 is a schematic diagram of signal waveforms corresponding to the amplifier 12 in a condition of n=1.5. In FIG. 3, the output voltage $V_{OUT}$ of the amplifier 12 has a small amplitude when operating in a power saving mode, such as an idle mode, so that setting n smaller than 1 can reduce quiescent current and power consumption. On the contrary, in FIG. 4, the output voltage $V_{OUT}$ of the amplifier 12 has a greater amplitude when operating in a normal mode, so that n can be set larger than 1. In this way, even if the voltage $CV_{SS}$ varies with charging and discharging capacitors of the charge pump 104, signals outputted from the amplifier 12 can be prevented from being curtailed since the voltage $CV_{SS}$ is 1.5 times the voltage $CV_{DD}$, meaning that the amplifier 12 has a wider output range in the negative polarity. Thus, the capacitors in the charge pump 104 can be replaced with capacitors of less capacitance, so that a size of the charge pump 104 can be reduced.

Figure 5:
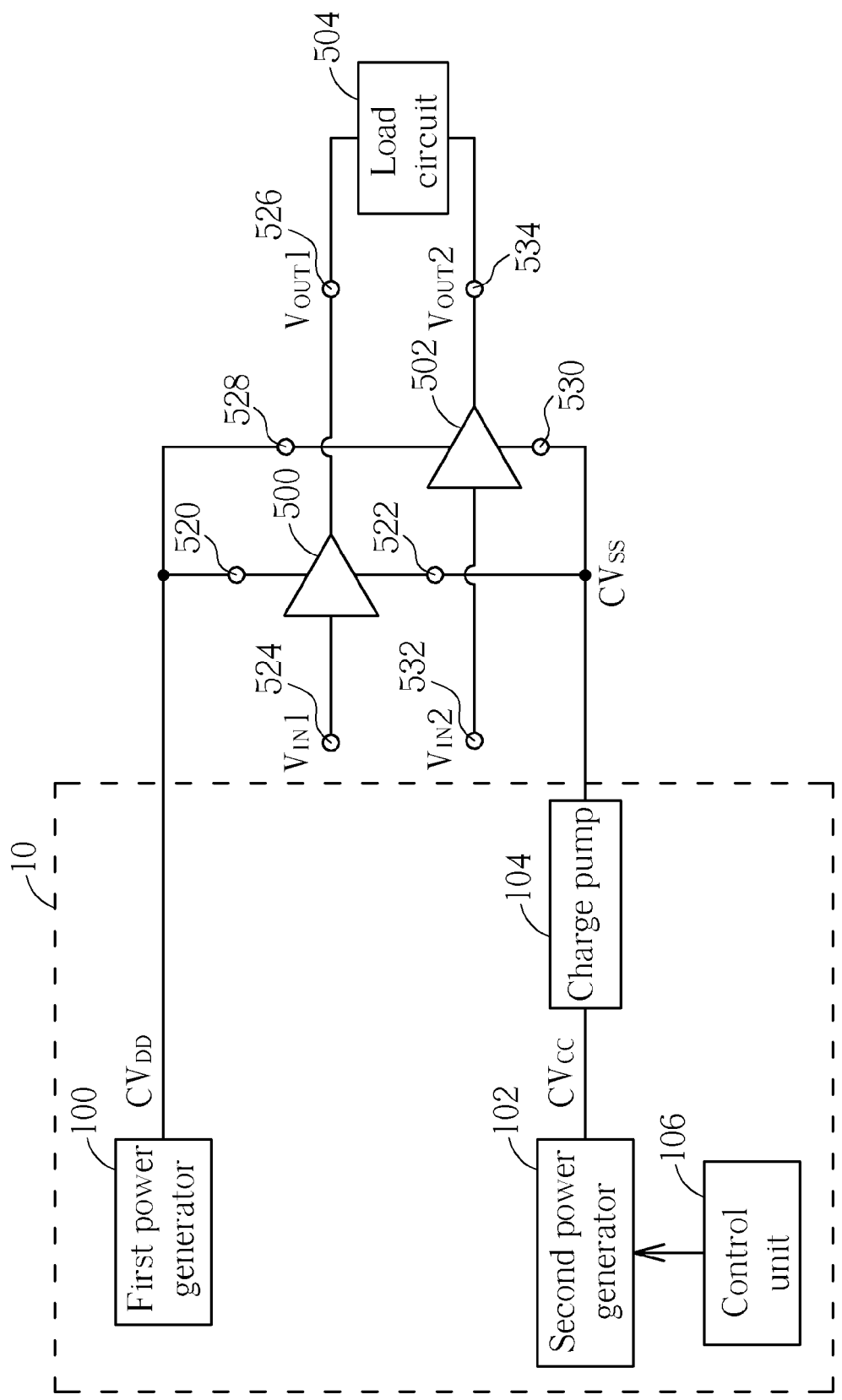
FIG. 5 depicts a schematic diagram of the power supply device for driving two amplifiers in FIG. 2.

Note that, the power supply device 10 shown in FIG. 2 is an exemplary embodiment of the present invention, and those skills in the art can make modification, such as driving a plurality of amplifiers, not just one. Please refer to FIG. 5, which is a schematic diagram of the power supply device 10 for driving amplifiers 500, 502 according to the present invention. The amplifiers 500, 502 receive driving power from positive reception ends 520, 528 and negative reception ends 522, 530, amplify signals $V_{IN}1$, $V_{IN}2$ received from signal reception ends 524, 532, and then output signals $V_{OUT}1$, $V_{OUT}2$ to a load circuit 504, such as a stereo headphone or a loudspeaker, through signal output ends 526, 534.

Figure 6:
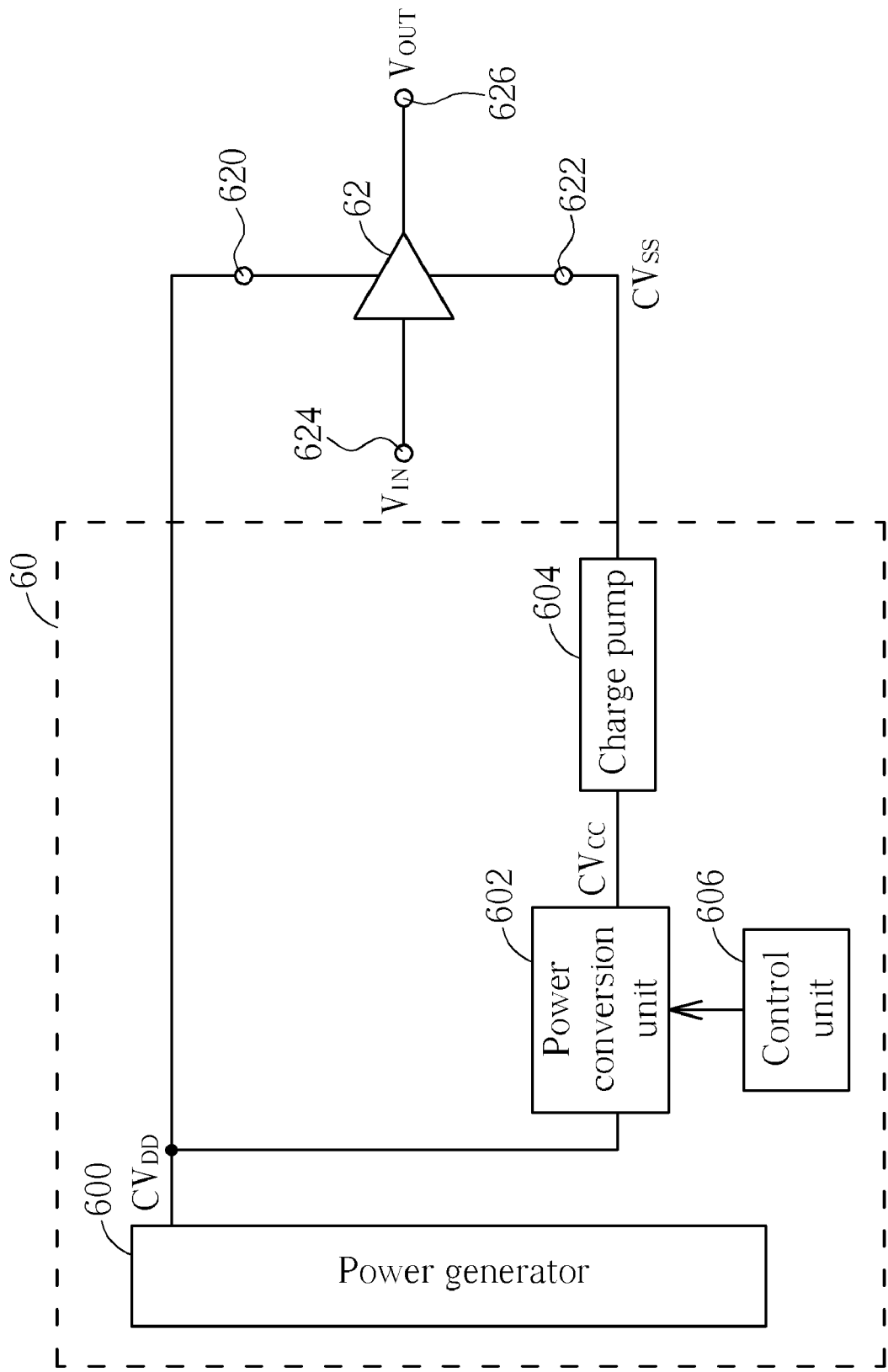
FIG. 6 depicts a schematic diagram of a power supply device for driving an amplifier according to a second embodiment of the present invention.

In addition, the present invention can also accomplish the same performance by one power generator. Please refer to FIG. 6, which is a schematic diagram of a power supply device 60 for driving an amplifier 62 according to a second embodiment of the present invention. The amplifier 62 receives driving power from a positive power reception end 620 and a negative power reception end 622, amplifies a signal $V_{IN}$ received by a signal reception end 624, and outputs a signal $V_{OUT}$ through a signal output end 626. The power supply device 60 includes a power generator 600, a power conversion unit 602, a charge pump 604 and a control unit 606. The power generator 600 provides a voltage $CV_{DD}$ for a positive power reception end 620 of the amplifier 62 and the power conversion unit 602. The power conversion unit 602 converts the voltage $CV_{DD}$ into a voltage $CV_{CC}$ and outputs the voltage $CV_{CC}$ to the charge pump 604. The charge pump 604 converts the voltage $CV_{CC}$ provided by the power conversion unit 602 into a negative voltage $CV_{SS}$ ($CV_{SS}=(-n2)\times CV_{CC}$) and outputs the voltage $CV_{SS}$ to the negative power reception end 622 of the amplifier 62. Besides, the control unit 606 controls the voltage $CV_{CC}$ of the power conversion unit 602, so as to adjust the voltage $CV_{SS}$ to make the voltage $CV_{DD}$ equal to a multiple of the voltage $CV_{SS}$, or $CV_{SS}=(-n)\times CV_{DD}$.

Therefore, in the power supply device 60, levels of positive and negative powers of the amplifier 62 may be different for applying to different situations. In a power saving mode (as shown in FIG. 3), the output voltage $V_{OUT}$ of the amplifier 62 has a small amplitude, so that setting n smaller than 1 can reduce quiescent current to reduce power consumption. On the contrary, in a normal mode (as shown in FIG. 4), the output voltage $V_{OUT}$ of the amplifier 62 has a greater amplitude, so that n can be set larger than 1. In this way, even if the voltage $CV_{SS}$ varies with charging and discharging capacitors of the charge pump 604, signals outputted from the amplifier 62 can be prevented from being curtailed since the voltage $CV_{SS}$ is 1.5 times the voltage $CV_{DD}$, meaning that the amplifier 62 has a wider output range in the negative polarity. Thus, the capacitors in the charge pump 604 can be replaced with capacitors of less capacitance, so that a size of the charge pump 604 can be reduced.

In summary, in the present invention power supply device, levels of the positive and negative powers of the amplifier can be different. In the power saving mode, the present invention can set n smaller than 1 for reducing quiescent current and saving power. In the normal mode, the present invention can set n larger than 1, so that the amplifier has a wider output range in the negative polarity. Under this circumstance, the capacitors in the charge pump can be replaced by capacitors of less capacitance, so that the size of the charge pump can be further reduced. In addition, due to two power generators driving multiple amplifiers, the present invention can prevent current variation generated by switching transistors from affecting system operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply device for driving an amplifier comprising:
   a power generator for providing a first voltage for a first power reception end of the amplifier;
   a power conversion unit coupled to the power generator, for converting the first voltage into a second voltage;
   a charge pump coupled between the power conversion unit and a second power reception end of the amplifier, for generating a third voltage for the amplifier according to the second voltage; and
   a control unit coupled to the power conversion unit, for controlling the power conversion unit, so as to adjust the second voltage to make the third voltage equal to a specific multiple of the first voltage.

2. The power supply device of claim 1, wherein the amplifier is used for amplifying audio signals.

3. The power supply device of claim 1, wherein the amplifier is an operational amplifier.

4. The power supply device of claim 1, wherein the control unit controls the power conversion unit to make the third voltage smaller than the first voltage when the amplifier operates in a power saving mode.

5. The power supply device of claim 1, wherein the control unit controls the power conversion unit to make the third voltage greater than the first voltage when the amplifier operates in a wide output range mode.

* * * * *